United States Patent
Hinrichs

(10) Patent No.: US 7,924,102 B2
(45) Date of Patent: Apr. 12, 2011

(54) SYMMETRIC LOAD DELAY CELL OSCILLATOR

(75) Inventor: Jeffrey M. Hinrichs, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 109 days.

(21) Appl. No.: 12/390,648

(22) Filed: Feb. 23, 2009

(65) Prior Publication Data

US 2010/0214032 A1    Aug. 26, 2010

(51) Int. Cl.
*H03K 3/03* (2006.01)
(52) U.S. Cl. .......... 331/57; 331/109; 327/266; 327/280
(58) Field of Classification Search .............. 331/57, 331/109, 182, 183, 185, 186; 327/158, 266, 327/274, 280, 287
See application file for complete search history.

(56) References Cited

U.S. PATENT DOCUMENTS

| | | | | |
|---|---|---|---|---|
| 6,043,719 A * | 3/2000 | Lin et al. | ......................... | 331/57 |
| 6,900,703 B2 * | 5/2005 | Garvin | ......................... | 331/183 |
| 7,295,079 B2 * | 11/2007 | Wu et al. | ......................... | 331/57 |
| 7,310,020 B2 * | 12/2007 | Tan et al. | ......................... | 331/16 |
| 7,567,140 B2 * | 7/2009 | Kim | ......................... | 331/183 |
| 7,719,370 B2 * | 5/2010 | Takai | ......................... | 331/57 |

* cited by examiner

*Primary Examiner* — Robert Pascal
*Assistant Examiner* — Levi Gannon
(74) *Attorney, Agent, or Firm* — Jiayu Xu

(57) ABSTRACT

An oscillator includes a control circuit and a ring of symmetric load delay cells. Each delay cell includes two novel symmetric loads. Each load involves a level shift circuit and a diode-connected transistor coupled in parallel with a current source-connected transistor. The control circuit converts an oscillator input signal into bias control signals that in turn control the effective resistance of the symmetric loads such that delays through the delay cells are a function of the input signal. The control circuit uses a symmetric load replica in a control loop to control the level shift circuits of the delay cells such that the oscillating delay cell output signals have a constant amplitude. In a first advantageous aspect, due to the constant amplitude, the oscillator is operable over a wide frequency range. In a second advantageous aspect, the oscillator input signal to output signal oscillation frequency has a substantially linear relationship.

23 Claims, 13 Drawing Sheets

DELAY CELL

PHASE-LOCKED LOOP

ICO

DELAY CELL

BIAS CONTROL CIRCUIT

CONVENTIONAL SYMMETRIC LOAD

I-V CURVES FOR CONVENTIONAL
SYMMETRIC LOAD

COMPOSITE I-V CURVES FOR CONVENTIONAL SYMMETRIC LOAD

SYMMETRIC LOAD WITH LEVEL SHIFTER THAT DECREASES THE GATE VOLTAGE (INCREASES VGS) OF THE DIODE-CONNECTED TRANSISTOR BY THE CHANGE IN VCTL AS ICTL CHANGES

NOW THE VOLTAGE DROP ACROSS SYMMETRIC LOAD IS CONSTANT DESPITE CHANGES IN ICTL

NOVEL SYMMETRIC LOAD

$$\text{REFF} = \frac{\Delta V}{\Delta I} = \frac{V_{DSAT} + V_T}{ICTL} = \frac{\sqrt{\frac{ICTL}{K}} + V_T}{ICTL}$$

EFFECTIVE RESISTANCE TO ICLT RELATIONSHIP FOR
CONVENTIONAL SYMMETRIC LOAD

FIG. 19

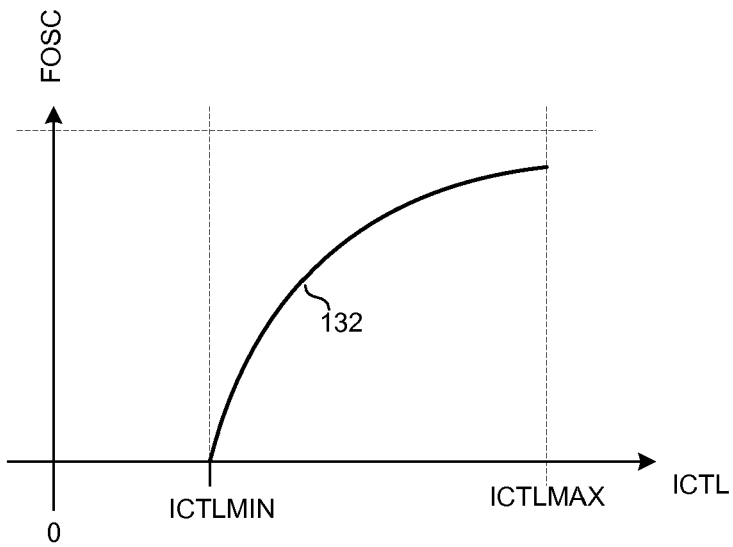

UNDESIRABLE NON-LINEAR FOSC TO ICTL RELATIONSHIP OF
CONVENTIONAL SYMMETRIC LOAD

FIG. 20

$$\text{REFF} = \frac{\Delta V}{\Delta I} = \frac{V_{DD} - V_{REF}}{\Delta I}$$

APPROXIMATE EFFECTIVE RESISTANCE RELATIONSHIP OF
THE NOVEL SYMMETRIC LOAD

FIG. 21

SYMMETRIC LOAD DELAY CELL OSCILLATOR

BACKGROUND INFORMATION

1. Technical Field

The disclosed embodiments relate to symmetric load delay cells such as are found in voltage-controlled oscillators (VCO) and current-controlled oscillators (ICO).

2. Background Information

Current-Controlled Oscillators (ICOs) see use in many circuits such as, for example, Phase-Locked Loops (PLL) within clock signal generators that supply clock signals to digital processors. ICOs sometimes also see use in local oscillators of radio receivers and radio transmitters and in other circuits. FIG. 1 (Prior Art) is a simplified diagram of one example of a simple PLL 1. PLL 1 includes a Voltage-Controlled Oscillator (VCO) 2 that in turn includes a voltage-to-current converter 3 and an ICO 4. The local oscillator (LO) signal output by ICO 4 is frequency divided by a loop divider 5. The resulting divided-down feedback signal 6 is phase-compared with respect to a reference clock signal XO by a phase detector 7. Phase detector 7 outputs an error signal that is processed by a charge pump 8 and loop filter 9 to generate a signal 10 that controls VCO 2. The feedback control loop operates to phase-lock the feedback signal 6 to the reference clock signal XO. By setting the frequency control value by which loop divider 5 divides, the frequency of the local oscillator signal LO can be set to have a desired frequency over a frequency tuning range.

FIG. 2 (Prior Art) is a simplified diagram of ICO 4 of FIG. 1. ICO 4 actually includes two current-controlled oscillators ICO#1 11 and ICO#2 12 because a single current-controlled oscillator of this type would not have an adequately wide tuning range. ICO 4 also includes two VCO buffer circuits 13 and 40 and a two-to-one digital logic multiplexer 41. Each VCO buffer circuit converts a differential ICO output signal into a single-ended digital signal. In the example of FIGS. 1 and 2, the overall ICO 4 is tunable to generate an output signal LO that ranges from approximately 400 MHz to 1.3 GHz. ICO#1 11 and VCO buffer circuit 40 are used when the LO signal is to be of a frequency in the 400 MHz to 800 MHz range, whereas ICO#2 12 and VCO buffer circuit 13 are used when the LO signal is to be of a frequency in the 800 MHz to 1.3 GHz range. Depending on the frequency of the desired output signal LO, one of the ICO 11 or 12 is enabled and other is disabled. Multiplexer 41 is controlled to output the output signal of the appropriate VCO buffer circuit as the single-ended local output signal LO.

FIG. 3 (Prior Art) is a more detailed diagram of ICO#1 11 of FIG. 2. This particular ICO circuit is ring oscillator and involves a bias control circuit 14, and a plurality of delay cells 15-19. The delay cells have differential signal inputs and differential signal outputs. ICTL signal 37 is input control signal ICTL 20 received via transistor 38 of FIG. 2 from the voltage-to-current converter 3 of FIG. 1.

FIG. 4 (Prior Art) is a diagram that illustrates bias control circuit 14 and delay cell 15 in further detail. All the delay cells of FIG. 3 are of similar topology. Delay cell 15 includes a pair of circuits 21 and 22 referred to as "symmetric loads". The first symmetric load 21 includes a current source-connected transistor (CSCT) 23 and diode-connected transistor (DCT) 24. The second symmetric load 22 includes a current source-connected transistor (CSCT) 25 and diode-connected transistor (DCT) 26. Delay cell 15 also includes a tail current source transistor 28 and two current steering switching transistors 29 and 30. Tail current transistor 28 pulls a substantially fixed control current ICTL from node N3. As the differential input signal (VIP minus VIN) between inputs nodes 31 and 32 switches, current ICTL is steered to flow through the first symmetric load, and then through the second symmetric load, and back again. The differential output signal VOP minus VON present between nodes N2 34 and N1 33 is output via leads 36 and 35 to the next delay cell in the ring of delay cells.

FIG. 5 (Prior Art) illustrates operation of delay cell 15 during a first portion of a switching cycle. Switching transistor 29 is relatively conductive and switching transistor 30 is relatively nonconductive. The voltage on node N1 is pulled down to be lower than the voltage on node N2. The voltage of the output signal therefore increases as capacitor 39 charges. Resistor symbol R1 represents the parallel equivalent effect resistance of the first symmetric load 21. Resistor symbol R2 represents the parallel equivalent effect resistance of the second symmetric load 22.

FIG. 6 (Prior Art) illustrates operation of delay cell 15 during a second portion of the switching cycle. Switching transistor 29 is relatively nonconductive and switching transistor 30 is relatively conductive. The voltage on node N2 is therefore pulled down to be lower than the voltage on node N1. The voltage of the output signal therefore decreases as capacitor 39 discharges.

FIG. 7 (Prior Art) is a simplified waveform diagram that illustrates how the differential output signal between nodes N2 and N1 oscillates up and down as the switching transistors 29 and 30 are controlled to be on and off from cycle to cycle. The lower swing limit of the output signal is referred to as the Lower Swing Limit Voltage (LSLV). The upper swing limit of the output signal is approximately the high supply voltage VDD of the circuit. For additional information on a delay cell of this type involving symmetric loads see the article "Low-Jitter Process-Independent DLL and PLL Based on Self-Biased Techniques", IEEE Journal of Solid-State Circuits, Vol. 31, No. 11, November 1996, by John G. Maneatis.

The frequency of oscillation of the ring oscillator is changed by changing the input control current ICTL. The circuit is therefore referred to as a current-controlled oscillator.

If control current ICTL supplied to bias control circuit 14 is increased, then the current ICTL pulled through the tail transistor 28 increases. Also, the PBIAS control voltage decreases. The decrease in the PBIAS control signal reduces the effective resistance REFF of the first and second symmetric loads 21 and 22. The reducing of the effective resistance REFF reduces the RC delay through the delay cell, thereby increasing the frequency of oscillation FOSC. Similarly, decreasing control current ICTL supplied to bias control circuit 14 causes a decrease in the frequency of oscillation FOSC.

Although a ring oscillator of this type works well in certain applications, it may have an undesirably narrow frequency tuning range. As the input control current ICTL increases, the voltage swing of the output signal between nodes N2 and N1 increases. The lower swing limit voltage LSLV drops lower and lower as ICTL increases and increases. Because the lower voltage limit of the output signal has a lower voltage limit, the frequency tuning range of the ring oscillator circuit is effectively limited.

FIG. 8 (Prior Art) is a chart that illustrates how ICO#1 is only usable over a limited frequency tuning range up to 800 MHz because at the upper input control current limit of ICTL-MAX the voltage swing of its output signal has reached its maximum allowable voltage swing. Note in FIG. 8 that the dashed line representing the voltage swing has reached the MAX ALLOWABLE VOLTAGE SWING value. As a result, if the frequency tuning range of the overall ICO 4 of FIG. 1 is to extend above 800 MHz, then a second ICO#1 must be provided. The circuit of FIG. 2 therefore includes ICO#2. In addition, as FIG. 8 illustrates, the change in frequency of oscillation FOSC is significantly non-linear with respect to changes in input control current ICTL. Note that the solid line representing the relationship of FOSC to ICTL is not a straight line, but rather is curved. At the upper end of frequency operation of an ICO of this type, the input control current ICTL must be increased a relatively large amount in order to increase the oscillation frequency FOSC a relatively small amount. An improved circuit is desired.

SUMMARY

A novel Current Controlled Oscillator (ICO) includes a novel bias control circuit and a number of novel symmetric load delay cells. The novel symmetric load delay cells are coupled together in a ring to form a ring oscillator. An oscillator input control current (ICTL) supplied to the bias control circuit controls the oscillation frequency (FOSC) of an oscillator output signal output by the ring of delay cells.

Each delay cell includes a pair of novel symmetric load circuits. Each novel symmetric load circuit includes a current source-connected transistor, a diode-connected transistor, and a novel level shift circuit. The novel level shift circuit can adjust the gate-to-source voltage (VGS) of the diode-connected transistor in response to a control signal referred to as the "Lower Swing Limit Control Signal" (LSLCS). First and second switching transistors within the delay cell steer a control current to flow from a voltage supply node (VDD node) through one or the other of the symmetric loads, then through a conductive one of the switching transistors, and then through a tail current source transistor to a ground node (GND node). The effective resistance of the symmetric loads is determined at least in part by a control signal PBIAS supplied to the current source-connected transistor, by a control signal NBIAS supplied to the tail current source, and by the LSLCS control signal supplied to the level shift circuits of the delay cell. The delay of the delay cell, and therefore the frequency of oscillation of the ring of delay cells, is controlled by using the control signals PBIAS, NBIAS and LSLCS to control the effective resistance of the symmetric loads. The novel bias control circuit generates the PBIAS, NBIAS and LSLCS control signals such that the effective resistance of the symmetric loads in the delay cells changes to change the ring oscillator frequency as a function of the input control current ICTL.

The novel bias control circuit also includes a replica circuit. The replica circuit includes a replica of the novel symmetric load, a replica of a switching transistor, and a replica of a tail current source transistor coupled together as these circuits are coupled together in one of the delay cells. The voltage dropped across the replica symmetric load in this replica circuit is the same as the voltage dropped across one of the symmetric loads in a delay cell when the switching transistors in the delay cell are switched such that all the tail current flows through one of the symmetric loads. The voltage on a node of the symmetric load in the delay cell in this condition is the lower limit of the voltage of the output signal of the delay cell (the "lower swing limit voltage"). This lower limit is the lower swing limit voltage of the oscillating signal as output from the delay cell. An operational amplifier in the novel bias control circuit is used in a feedback control loop to set the lower swing limit of the delay cells of the loop. The operational amplifier compares the voltage on the node of the replica symmetric load to a desired reference voltage (VREF). The operational amplifier outputs an error control voltage that is supplied to the replica level shift circuit such that the effective resistance of the replica symmetric load is such the voltage on the node has the desired reference voltage value VREF. Because the replica level shift circuit in the bias control circuit is of identical construction to the level shift circuits in the delay cells, supplying the control voltage from the operational amplifier to the level shifting circuits in the delay cells causes the lower swing limit voltage of the output signals of the delay cells to be fixed to VREF. Setting the lower swing limit voltage of the delay cells prevents the amplitude of the oscillating output signals of the delay cells from increasing as a function of increasing oscillation frequency. In a first advantageous aspect, fixing output signal amplitude in this way increases the frequency tuning range of the ICO. In a second advantageous aspect, fixing output signal amplitude causes the input control current (ICTL) to output signal frequency (FOSC) relationship of the ICO to be substantially linear as compared to conventional JCOs involving conventional symmetric loads.

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advantages of the devices and/or processes described herein, as defined solely by the claims, will become apparent in the non-limiting detailed description set forth herein.

BRIEF DESCRIPTION OF THE DRAWINGS

FIG. 19 is an equation that describes the effective resistance REFF of a conventional symmetric load.

FIG. 20 is a diagram that illustrates the relationship of input control current (ICTL) signal to the frequency of oscillation (FOSC) of a conventional ICO that employs conventional symmetric loads.

FIG. 21 is an equation that defines the effective resistance REFF of the novel symmetric load of FIGS. 15 and 18.

DETAILED DESCRIPTION

Figure 1:
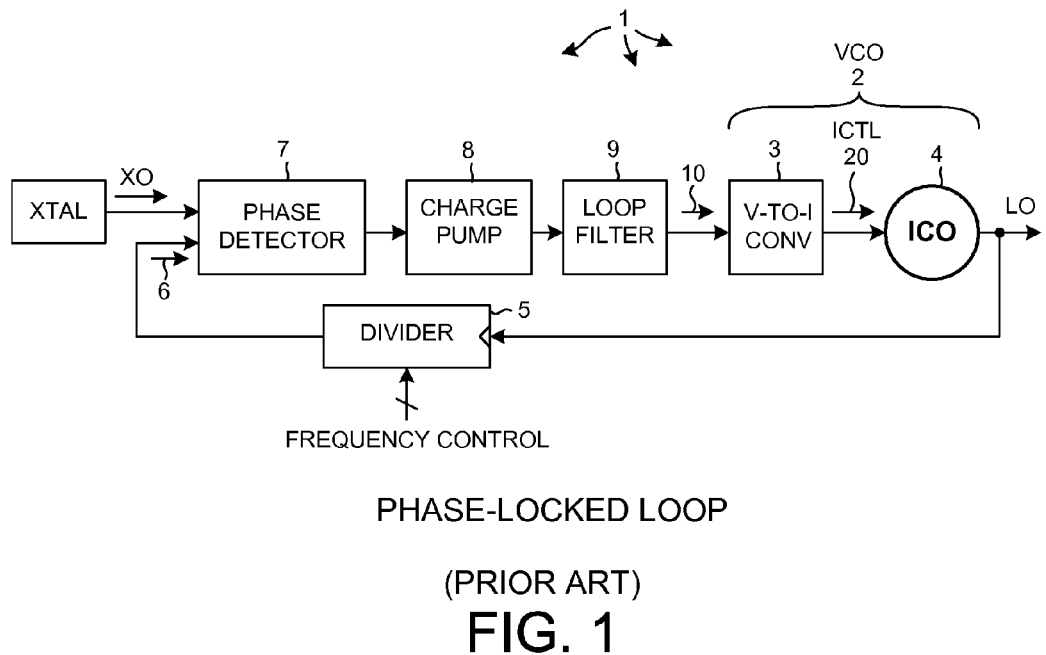
FIG. 1 (Prior Art) is a simplified diagram of one type of a conventional Phase-Locked Loop (PLL).
Figure 2:
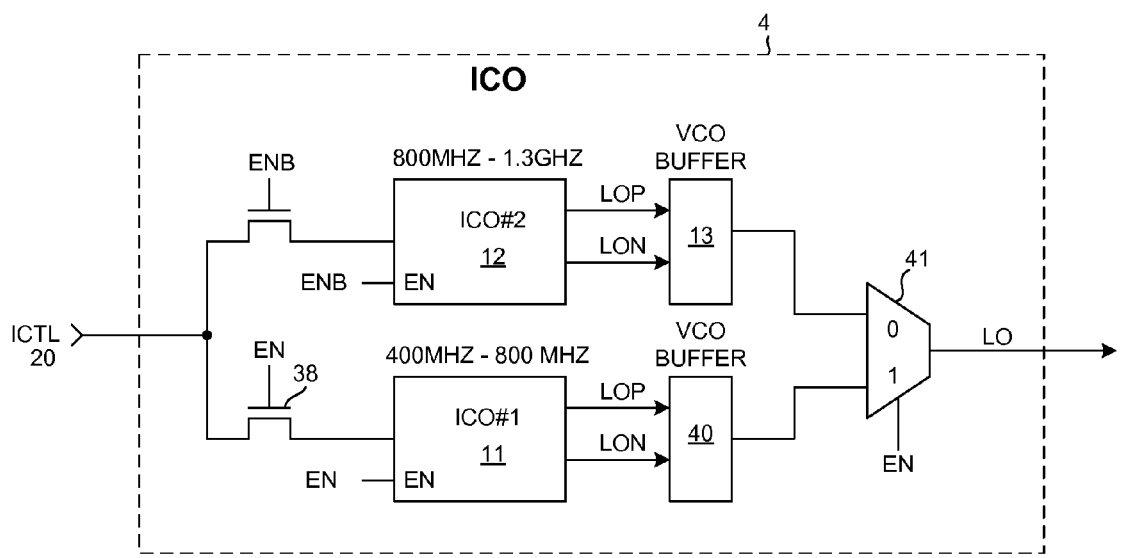
FIG. 2 (Prior Art) is a simplified diagram of a Current Controlled Oscillator (ICO) within the PLL of FIG. 1.
Figure 3:
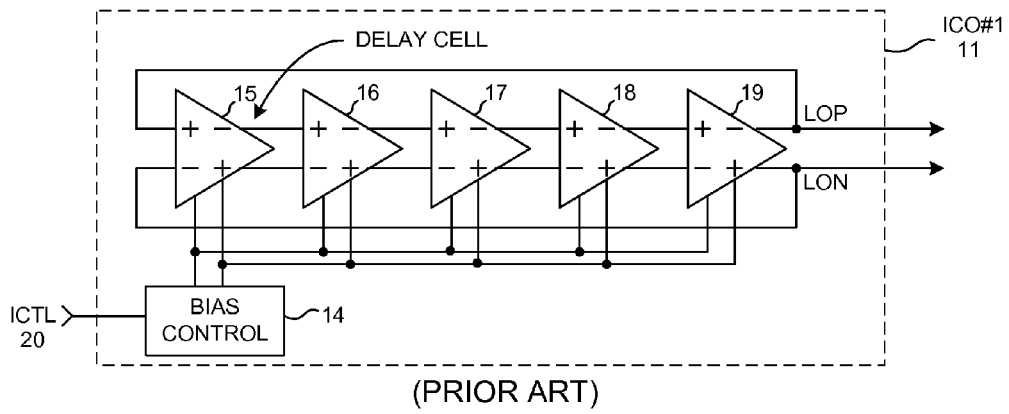
FIG. 3 (Prior Art) is a more detailed diagram of the ICO of FIG. 2.
Figure 9:
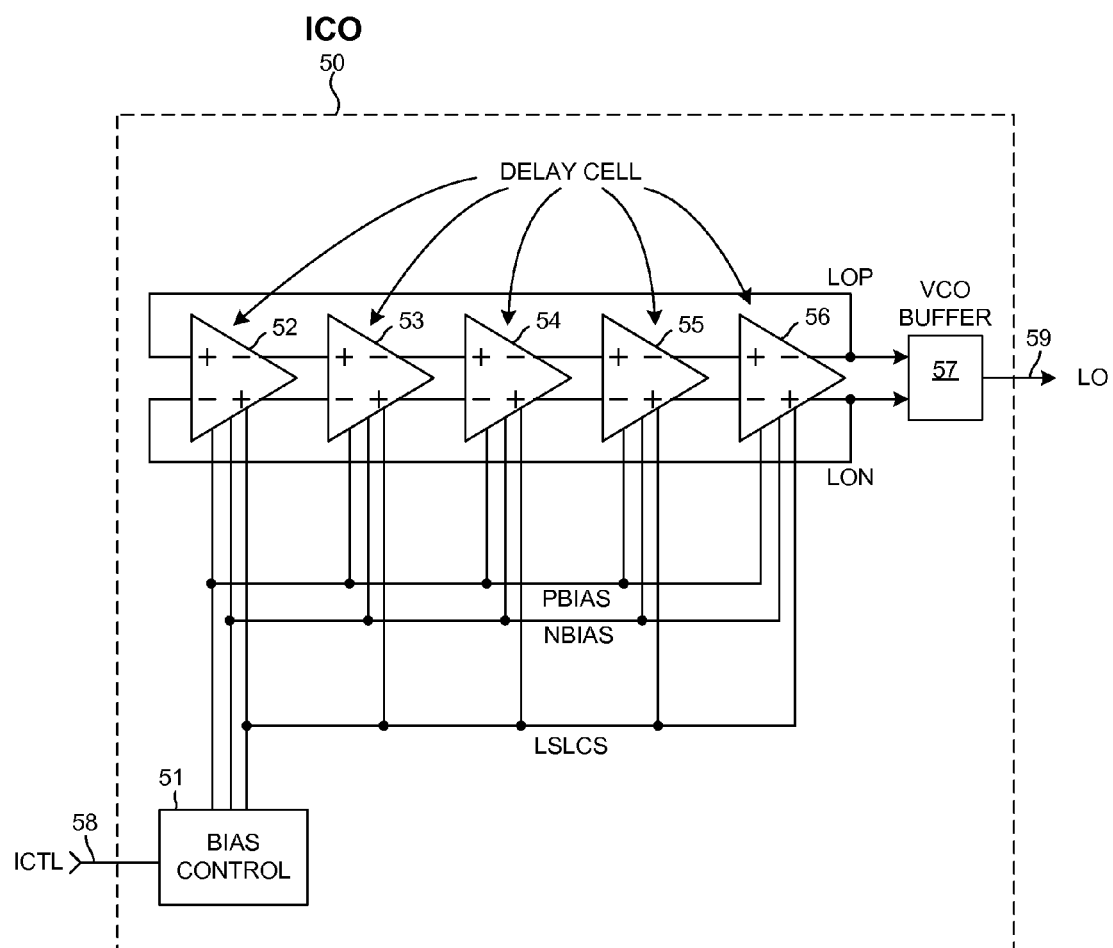
FIG. 9 is a simplified diagram of one example of a novel Current-Controlled Oscillator (ICO) in accordance with one novel aspect.

FIG. 9 is a simplified diagram of one example of a Current-Controlled Oscillator (ICO) 50 in accordance with one novel aspect. ICO 50 may, for example, see use in a Phase-Locked Loop (PLL) within a local oscillator of a radio receiver or a radio transmitter. ICO 50 includes a bias control circuit 51, five delay cell stages 52-56 coupled together in a ring, and a VCO buffer 57. Increasing an input control current ICTL received on input lead 58 results in a corresponding increase in the frequency of oscillation (FOSC) of an output signal LO on output lead 59. Unlike the conventional circuit of FIG. 3, the input control current to output frequency relationship is substantially linear over a relatively wide frequency tuning range.

Figure 10:
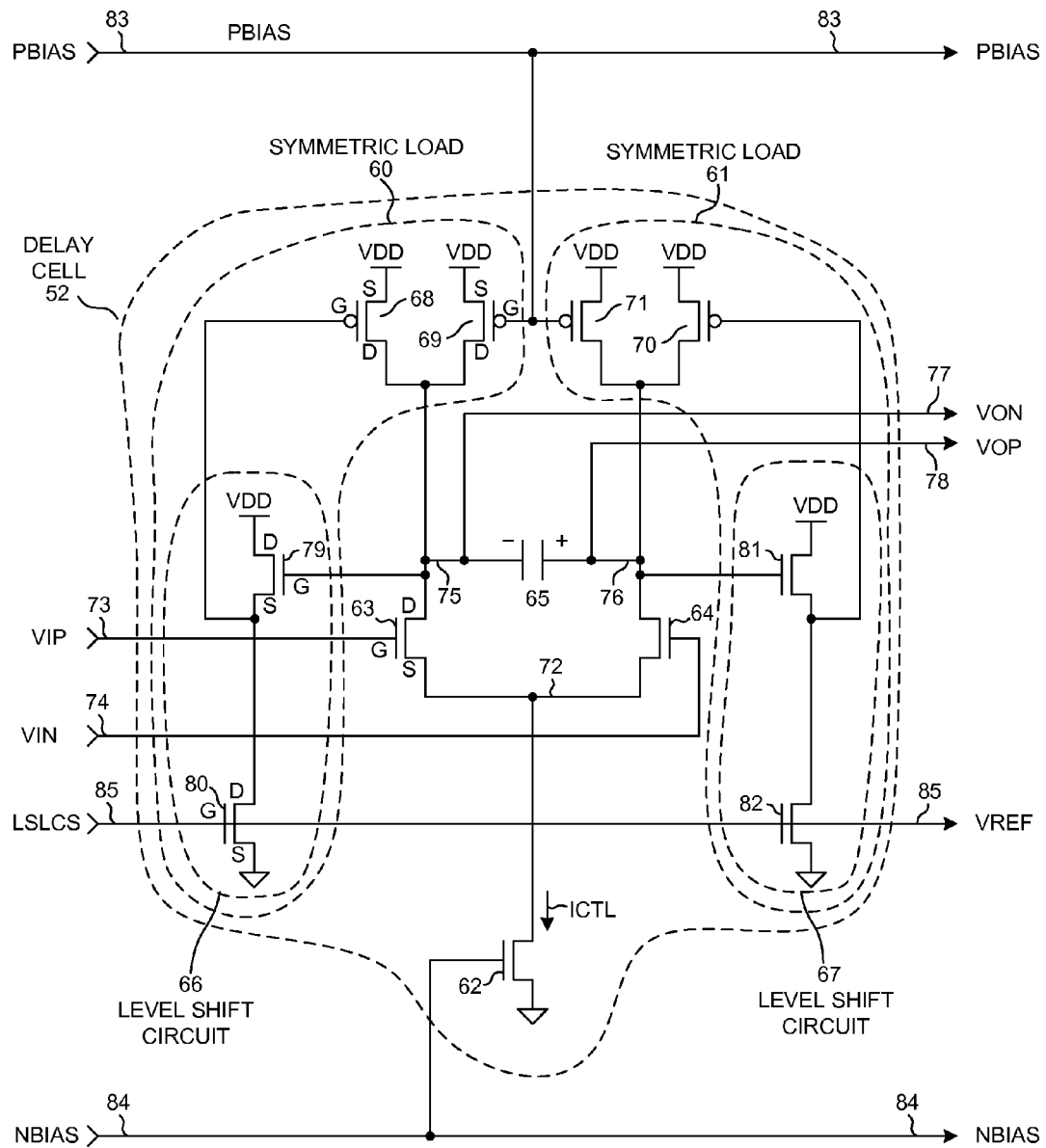
FIG. 10 is a more detailed diagram of one of the delay cells of the novel ICO of FIG. 9.

FIG. 10 is a more detailed diagram of delay cell 52 of FIG. 9. All delay cells 52-56 are of identical construction. Delay cell 52 includes a first symmetric load 60, a second symmetric load 61, a tail current source transistor 62, a first switching transistor 63, a second switching transistor 64, an output capacitor 65, a novel first level shift circuit 66, and a novel second level shift circuit 67. Each symmetric load includes a diode-connected transistor and a current source-connected transistor. As it is used in this application, the term diode-connected transistor includes both a transistor with its gate and drain connected together and a transistor with a level shifter connected between its gate and drain. The two transistors are coupled together in parallel between a supply voltage (VDD) node and another node so that the symmetric load provides an effective resistance REFF between the two nodes. First symmetric load 60 includes diode-connected transistor 68, current source-connected transistor 69, and a novel level shift circuit 66. Second symmetric load includes diode-connected transistor 70, current source-connected transistor 71, and novel level shift circuit 67. Tail current source transistor 62 is biased by bias voltage NBIAS so that tail current source transistor 62 pulls a control current ICTL from node 72. First and second switching transistors 63 and 64 are controlled to either steer the control current ICTL to flow from the supply voltage VDD node, through first symmetric load 60, through first switching transistor 63 and to node 72, or to flow from the supply voltage VDD node, through second symmetric load 61, through second switching transistor 64 and to node 72. As the delay cell switches, first switching transistor 63 turns on as second switching transistor 64 turns off, and then second switching transistor 64 turn on as first switching transistor 63 turns off, and so forth. The switching of the switching transistors 63 and 64 is controlled by the differential signal (VIP-VIN) on input nodes 73 and 74. The output signal from the delay cell is present between nodes 76 and 75 across capacitor 65. The output signal VOP-VON is present between output leads 78 and 77.

Figure 4:
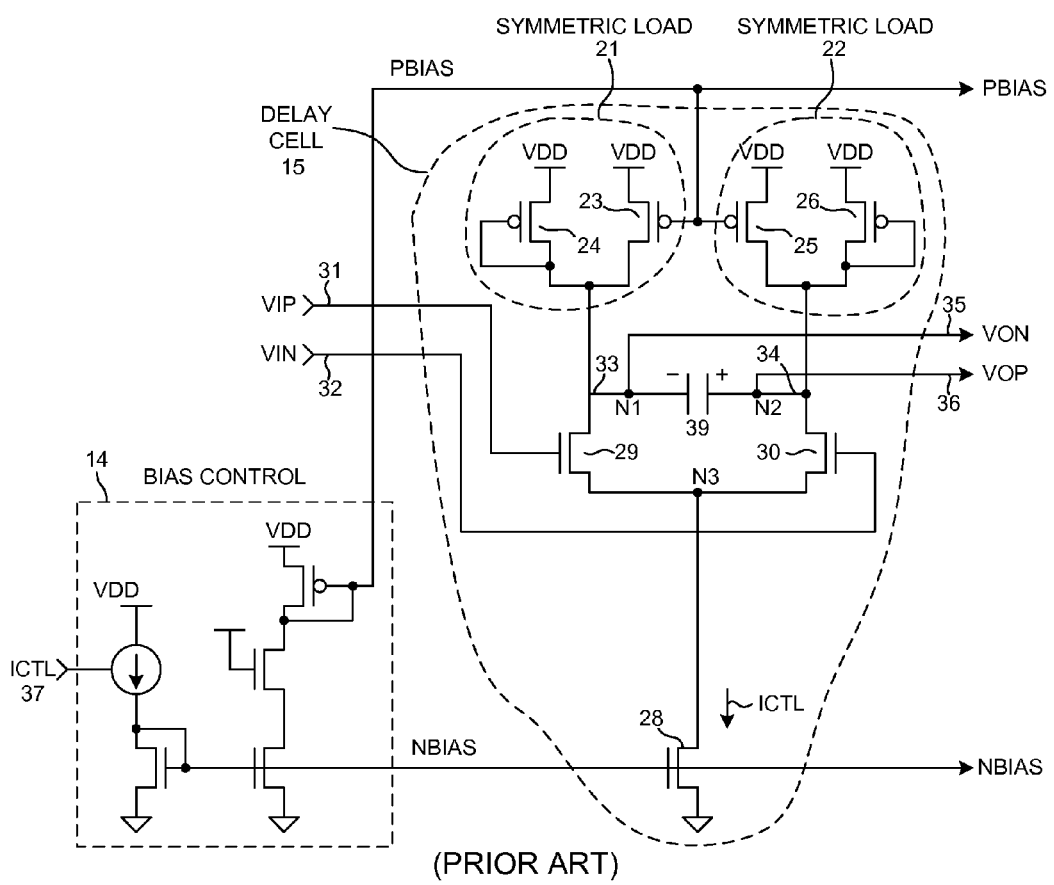
FIG. 4 (Prior Art) is a simplified diagram that illustrates the bias control circuit and one of the delay cells of FIG. 3 in further detail FIGS. 5 and 6 (Prior Art) are diagrams that illustrate operation of a delay cell of FIG. 3 during first and second portions of a switching cycle of the switching transistors of the delay cell.
Figure 5:
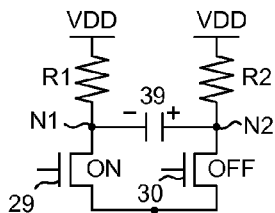
Figure 6:
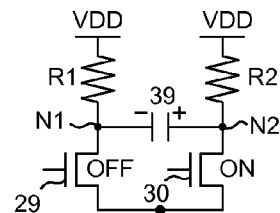
Figure 7:
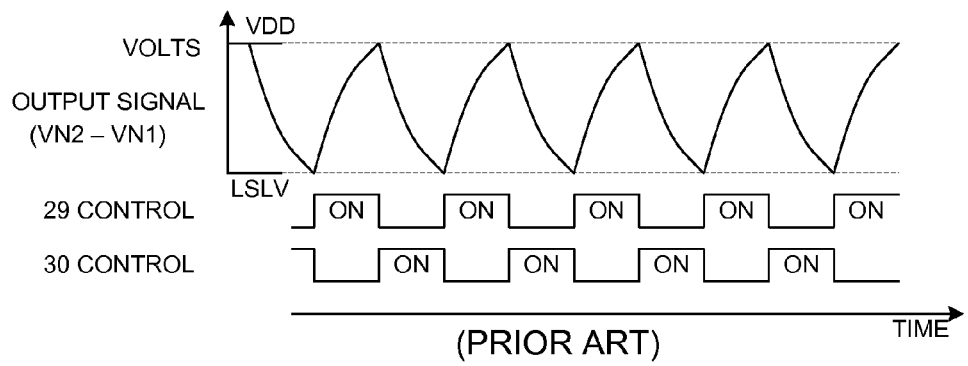
FIG. 7 (Prior Art) is a simplified waveform diagram that illustrates oscillation of the output signal from a delay cell as it cycles.
Figure 8:
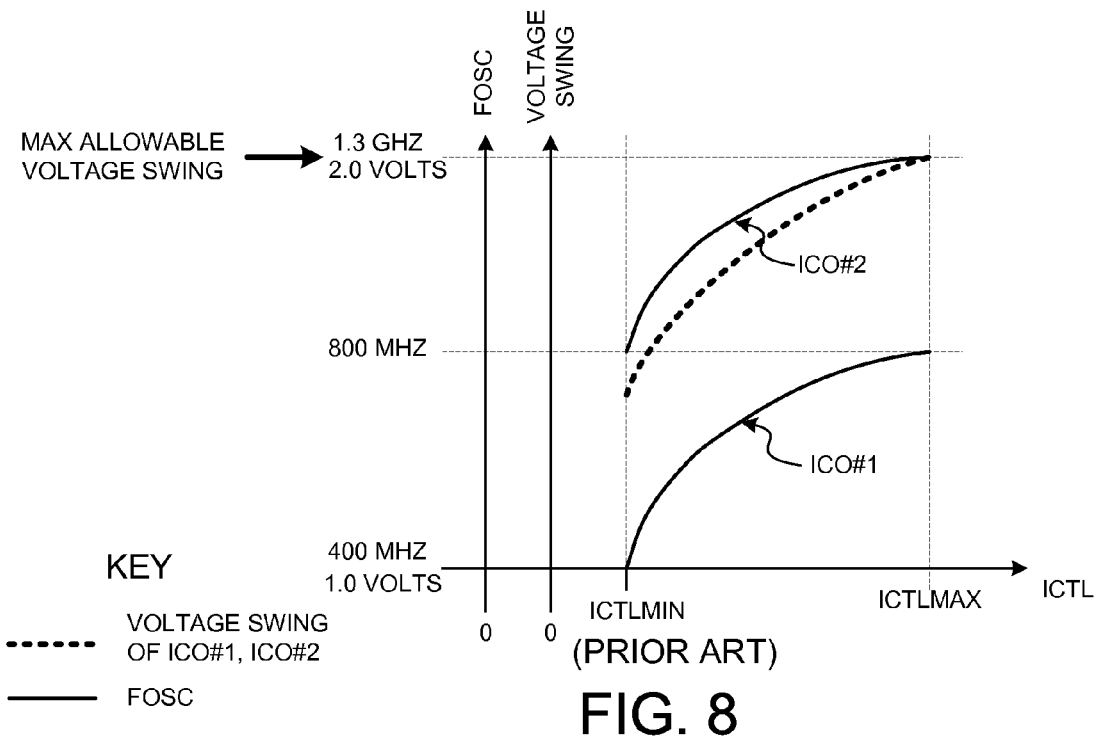
FIG. 8 (Prior Art) is a chart that illustrates how the voltage swing of the output signal of a delay cell in the ICOs of FIG. 2 increase as a function of input control current (ICTL), and how the frequency of oscillation of the ICO changes in a non-linear fashion as a function of ICTL.

As in the conventional delay cell of FIG. 4, signal delay through delay cell 52 is primarily controlled by the effective resistance REFF of the symmetric loads 60 and 61 and the magnitude of the control current ICTL flowing through tail current source transistor 62. To reduce the signal delay through delay cell 52, the bias voltage PBIAS decreases as control current ICTL is increased. Decreasing PBIAS increases the magnitude of the gate-to-source voltage (VGS) on transistors 69 and 71, thereby decreasing the effective resistances of the symmetric loads 60 and 61, thereby decreasing an RC time constant of the delay cell, and thereby decreasing signal propagation delay through the delay cell.

Novel level shift circuit 66 includes a level shift transistor 79 and a level shift current source transistor 80. Transistor 80 is a source follower. Similarly, novel level shift circuit 67 includes a level shift transistor 81 and a level shift current source transistor 82. Transistor 82 is a source follower. Operation of these two level shift circuits 66 and 67 is explained in further detail below.

Figure 11:
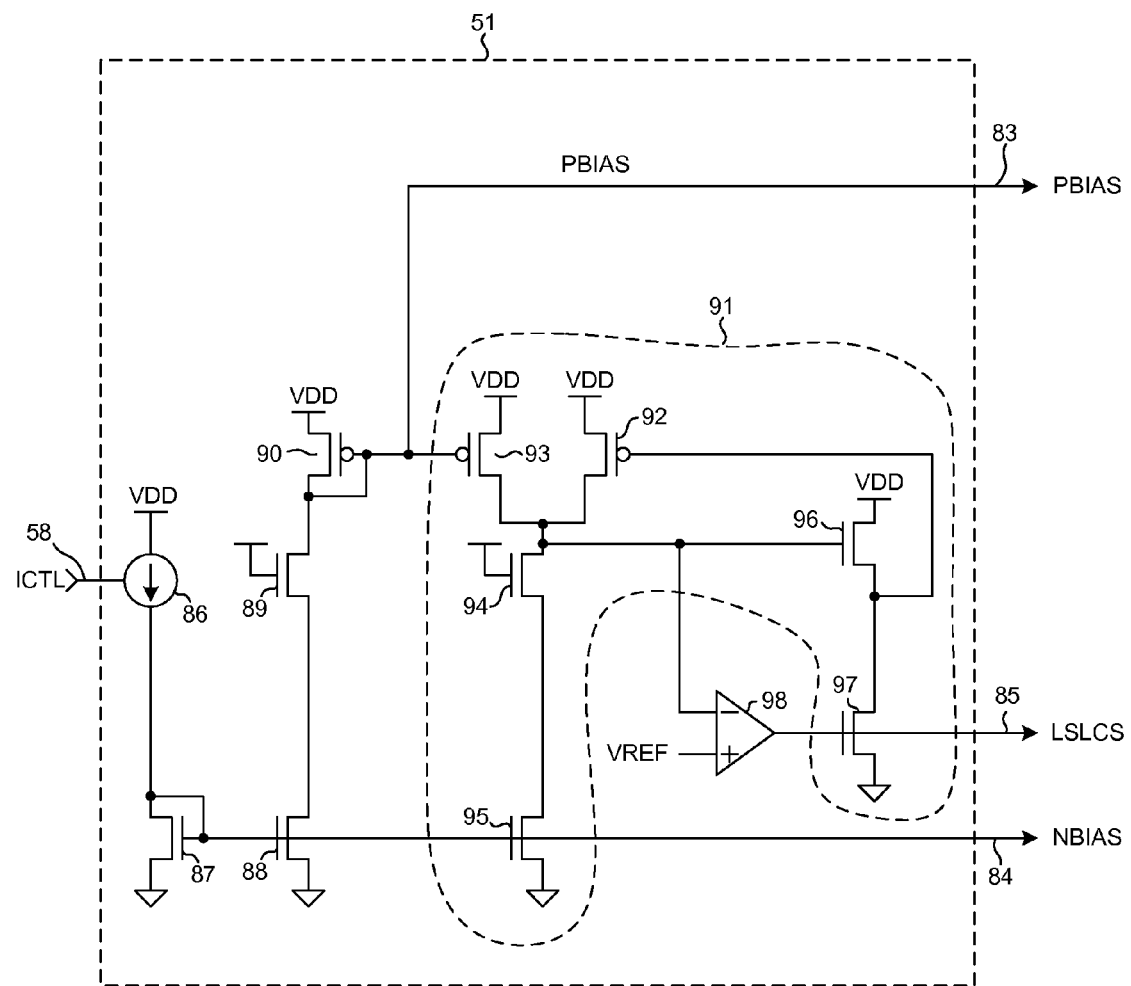
FIG. 11 is a circuit diagram of the novel bias control circuit of the novel ICO of FIG. 9.

FIG. 11 is a circuit diagram of bias control circuit 51 of FIG. 9. Bias control circuit 51 receives the input control current ICTL on input lead 58 and outputs the PBIAS control signal on conductor 83, outputs the NBIAS control signal on conductor 84, and outputs a novel Lower Swing Limit Control Signal (LSLCS) on conductor 85. Current controlled current source 86, the current mirror of N-channel transistors 87 and 88, and N-channel transistor 89 and P-channel transistor 90 correspond to the devices illustrated in bias control circuit 14 of the conventional circuit of FIG. 4. The novel bias control circuit 51 of FIG. 9, however, includes a replica circuit 91. Replica circuit 91 includes a replica of a symmetric load 92 and 93 of a delay cell, a replica of a switching transistor 94 of a delay cell, a replica of a tail current source transistor 95 of the delay cell, and a replica of the transistors 96 and 97 of a level shift circuit of a delay cell. In addition, the novel bias control circuit 51 includes an operational amplifier 98 operatively coupled as illustrated. Operational amplifier 98 in this case is a single-stage current-mirror operational amplifier having N-channel inputs. The novel bias control circuit 51 of FIG. 11 generates the PBIAS and NBIAS control voltage signals on conductors 83 and 84 in similar fashion to the way that the conventional bias control circuit 14 of FIG. 4 generates the PBIAS and NBIAS control voltage signals.

Operational amplifier 98 is connected in a feedback loop with the replica circuit 91. The replica switching transistor 94 of the replica circuit 91 is always on, so the current from the current mirror of N-channel transistors 87 and 95 is always being pulled through the replica symmetric load. This means that the voltage at the drains of transistors 92 and 93 is equal to the lower swing voltage on the output signal of the delay cell 52 when the oscillator is oscillating. This voltage is present on the inverting input lead of the operational amplifier 98. The operational amplifier 98 receives a reference voltage (VREF) on its non-inverting input lead and compares the voltage on the inverting input lead to VREF. If VREF differs from the voltage on the inverting input lead of the operational amplifier 98, operational amplifier 98 adjusts the current through the replica symmetric load via the feedback loop until the voltage at the replica symmetric load (on the drains of transistors 92 and 93) is equal to VREF. Lead 85 provides this current adjustment signal as the "Lower Swing Limit Control Signal" to each delay cell of the oscillator, including to delay cell 52 as illustrated in FIG. 10.

Figure 12:
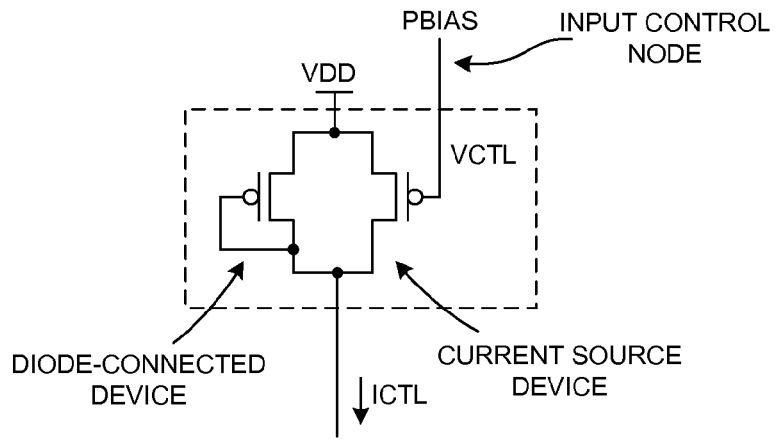
FIG. 12 is a simplified diagram of a conventional symmetric load of a delay cell.

FIG. 12 is a simplified diagram of a conventional symmetric load. The conventional symmetric load includes a first transistor that is connected in a configuration referred to here as a diode-connected configuration, and a second transistor that is connected in a configuration referred to here as a current source-connected configuration.

Figure 13:
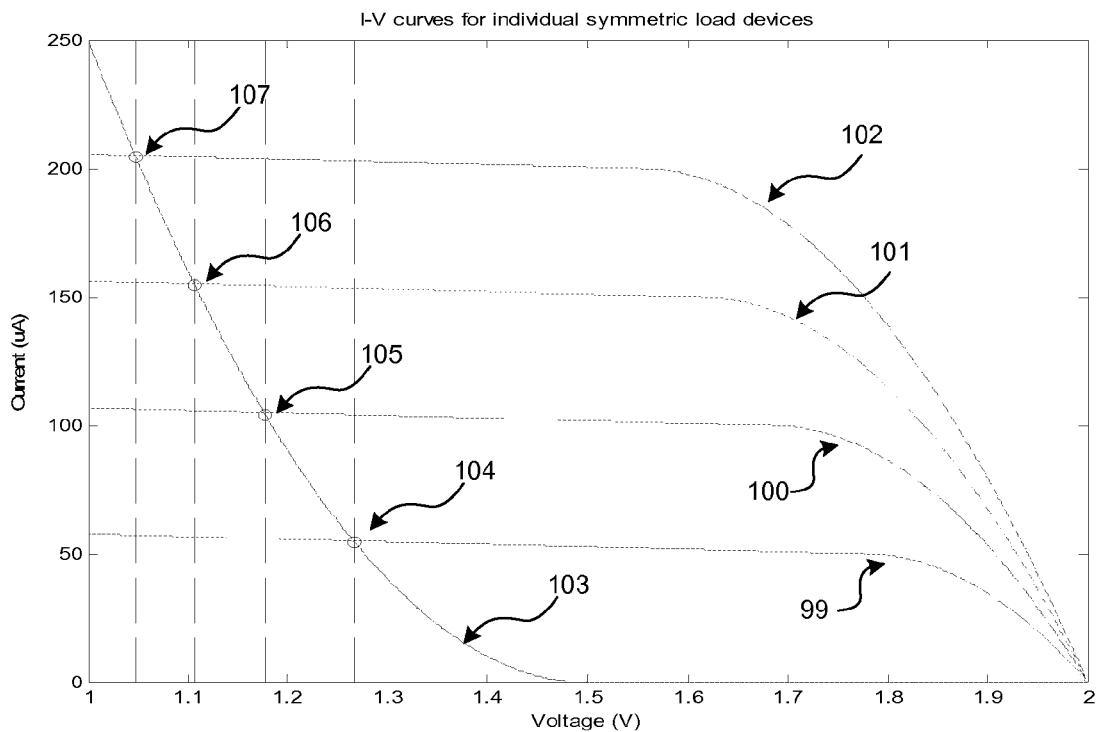
FIG. 13 is a diagram that illustrates the current-to-voltage relationship (referred to as the I-V curve) for both the diode-connected device and the current source-connected device of the conventional symmetric load of FIG. 12.

FIG. 13 is a diagram that illustrates the current-to-voltage relationship (referred to as the I-V curve) for the both the current source-connected device and the diode-connected device of the conventional symmetric load of FIG. 12. Each of the lines corresponds to transistor operation at a different amount of drain current. For example, line 99 describes transistor operation for a drain current of 50 μa; line 100 describes transistor operation for a drain current of 100 μa; line 101 describes transistor operation for a drain current of 150 μa; and line 102 describes transistor operation for a drain current of 200 μa. FIG. 13 also includes a line 103 that describes operation of the diode-connected transistor. As the gate-to-source voltage magnitude increases and reaches a threshold voltage, the transistor turns on rapidly resulting in an I-V curve similar to the I-V curve of a diode. Because the two transistors are coupled together in parallel, the voltage between the source and drain of one transistor is equal to the voltage between the source and drain of the other transistor. If ICTL is divided evenly between the current source-connected device and the diode-connected device, the lower swing limit voltage corresponds to the intersection of the I-V curves. Four such intersection points 104, 105, 106, and 107 are identified in the chart of FIG. 13.

Figure 14:
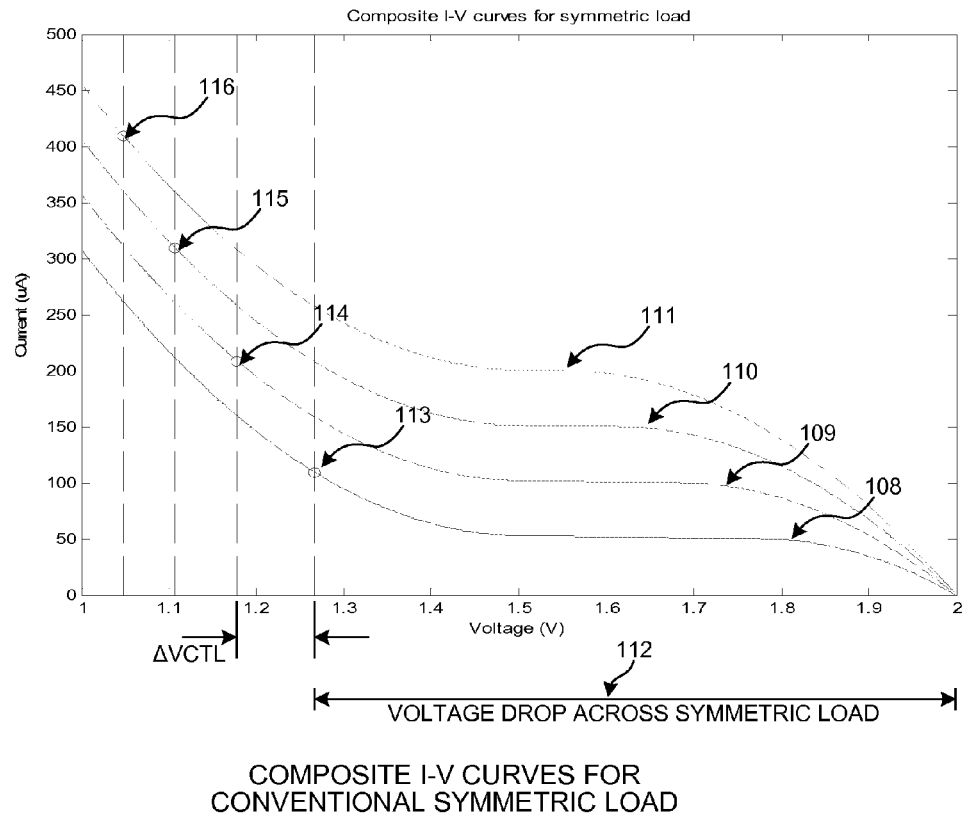
FIG. 14 is a diagram that illustrates the composite I-V curves for the conventional symmetric load of FIG. 12.

FIG. 14 is a diagram that illustrates the composite I-V curves for the conventional symmetric load of FIG. 13. The I-V curves for both transistors for a given ICTL are combined such that there are four composite curves 108, 109, 110 and 111 in FIG. 14. Arrow 112 represents the voltage drop across the symmetric load, with ΔVCTL representing the change in the control voltage VCTL when ICTL changes. The ratio of supply voltage (VDD) minus lower swing limit voltage to ICTL is considered an indication of the effective resistance of the symmetric load. Note that in FIGS. 13 and 14 the voltage drop across the symmetric load (between the source and drain of the two transistors) increases as the amount of current flowing through the symmetric load increases. In the horizontal dimension of FIG. 14, for example, the intersection points 113, 114, 115 and 116 occur at ever decreasing voltages. Because the sources of the transistors of the symmetric load in the delay cell are coupled to a supply voltage (VDD) node, the increasing voltage drop across the symmetric loads with symmetric load current results in the lower swing limit voltages on nodes 33 and 34 of FIG. 4 decreasing for increasing amounts of ICTL. When all the ICTL current is steered through one of the two symmetric loads and the voltage on the drains of the transistors of the symmetric load has reached its minimum, this low voltage is the lower swing limit voltage. There is a practical limit to how low the lower swing limit voltage can go before delay cell operation is affected. How low the lower swing limit voltage can go determines the tuning range limit of the delay cell. It is desired that the delay cell has a wider tuning range.

Figure 15:
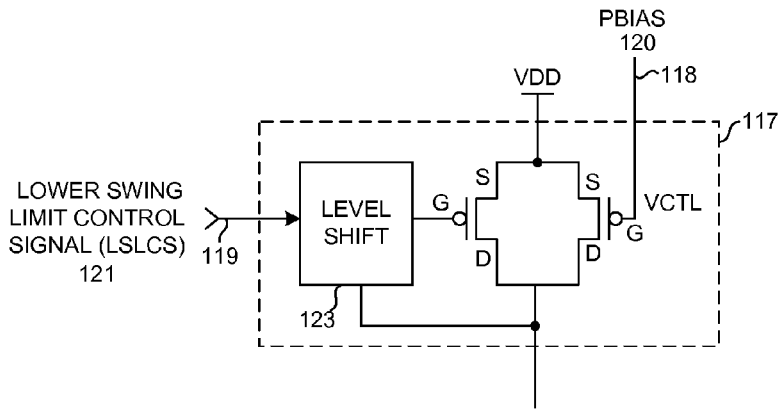
FIG. 15 is a simplified diagram of a novel symmetric load in the novel delay cell of FIG. 10.

FIG. 15 is a diagram of a novel symmetric load 117 in accordance with one novel aspect. Rather than just having one control input lead and signal such as the conventional symmetric load of FIG. 12, the novel symmetric load 117 of FIG. 15 has two control input leads 118 and 119 and two control input signals 120 and 121. A level shift circuit 123 adjusts and controls the gate voltage of the diode-connected transistor so that the gate-to-source voltage magnitude of the diode-connected transistor is increased by the change in VCTL (or equivalently ΔVDSAT) that the control voltage VCTL decreased from its maximum setting as ICTL increases as indicated in the I-V curves of FIG. 14.

Figure 16:
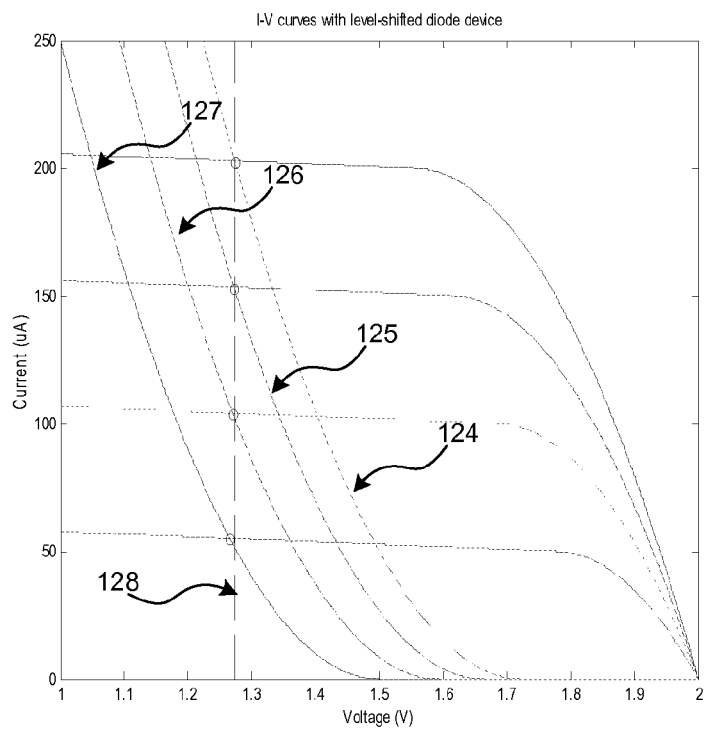
FIG. 16 is a chart that illustrates the current-to-voltage relationship (referred to as the I-V curve) for both the diode-connected device and the current source-connected device of the novel symmetric load of FIG. 15.

FIG. 16 is a chart that illustrates operation of the novel symmetric load 117 of FIG. 15. Now, for each I-V curve of the current source-connected transistor, there is a different I-V curve for the diode-connected transistor. Increasing ICTL effectively shifted the I-V curve for the diode-connected device to the left. Note that in FIG. 16 there are now four I-V curves for the diode-connected transistor 124, 125, 126 and 127. Due to operation of the level shift circuit, the voltage drop across the novel symmetric load remains at a constant voltage despite increasing and decreasing amounts of control current ICTL. The constant voltage drop is represented by the vertical dashed line 128.

Figure 17:
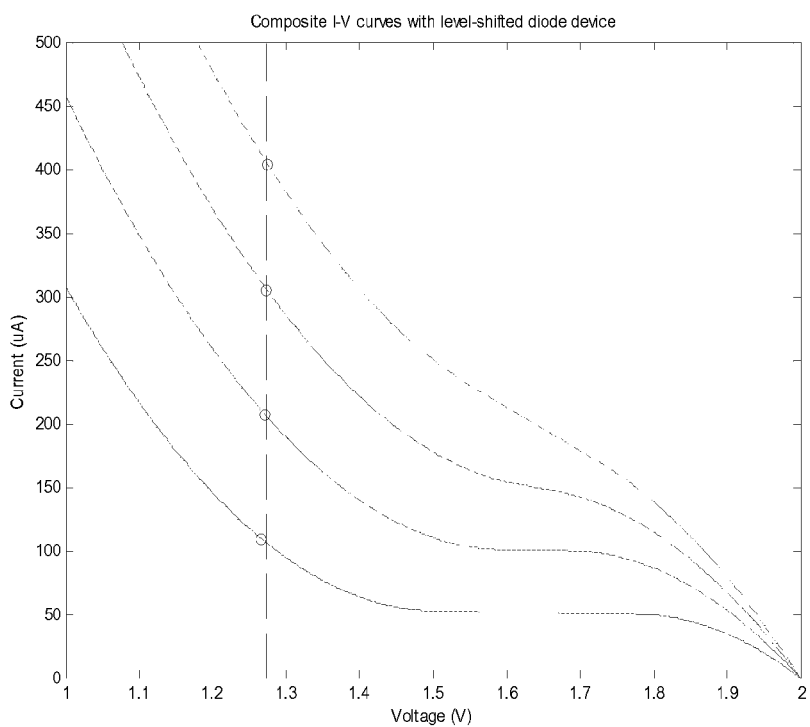
FIG. 17 is a chart that illustrates the composite I-V curves for the novel symmetric load of FIG. 15.

FIG. 17 is a chart that illustrates the composite I-V curves for the novel symmetric load of FIG. 15.

Figure 18:
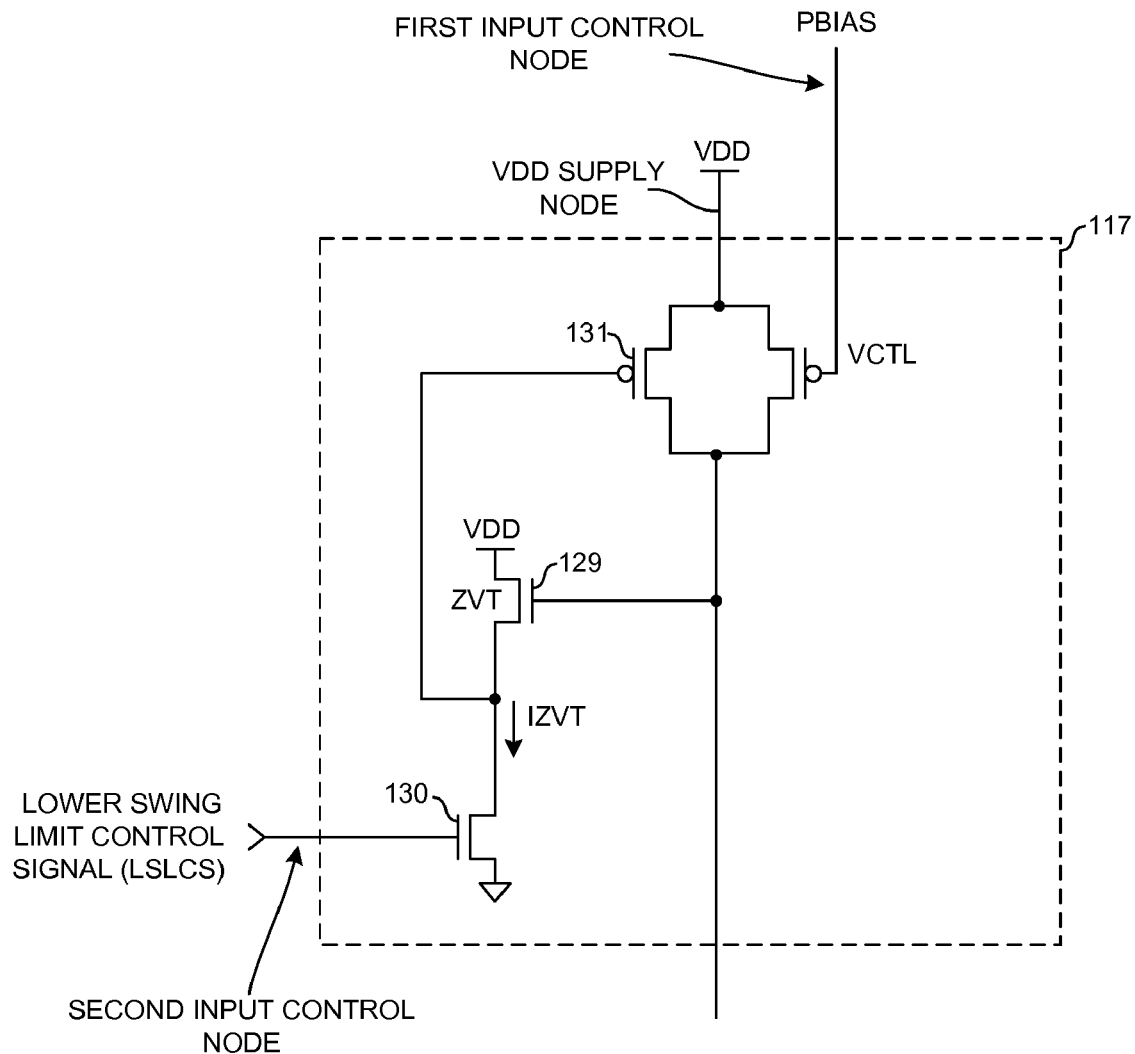
FIG. 18 is a more detailed diagram of one way the novel symmetric load of FIG. 15 can be realized.

FIG. 18 is a more detailed diagram of the novel symmetric load 117 of FIG. 15. Level shift circuit 123 includes a first zero threshold voltage transistor (ZVT) 129 and a second level shift current source transistor 130. How much the level shift circuit 123 adjusts the gate voltage of diode-connected transistor 131 is controlled by the Lower Swing Limit Control Signal (LSLCS). The symmetric loads 60 and 61 of the delay cell of FIG. 10 and the replica symmetric load of the control circuit of FIG. 11 are of the same construction as the novel symmetric load illustrated in FIG. 18.

FIG. 19 is an equation that defines the effective resistance REFF of a transistor of the prior art symmetric loads of FIG. 12. Effective resistance REFF is a function of input control current ICTL. VT is the inversion threshold voltage of either of the symmetric load transistors. VDSAT is the saturation voltage of the current source symmetric load transistor at a given value of ICTL. VDSAT plus VT defines the voltage range over which the load I-V curve is symmetric as shown in FIG. 13. For a given ICTL, the current swing for the composite symmetric load is ICTL and the voltage swing is VDSAT plus VT.

It is seen that effective resistance REFF does not decrease proportionally with increases in control current ICTL. Instead, effective resistance REFF is approximately proportional to the inverse of the square root of ICTL. In order to achieve increases in oscillation frequency FOSC of a delay cell, increasingly large values of ICTL are required to lower effective resistance REFF. Further, voltage swing increases with control current ICTL, bringing the delay cell closer to its tuning range limit.

FIG. 20 is a diagram that illustrates the relationship of control current ICTL to frequency of oscillation FOSC as defined by the equation of FIG. 19. Line 132 describing oscillation frequency FOSC as a function of control current ICTL in the prior art delay cell becomes increasingly flat for increased values of control current ICTL. At ICTLMAX, the corresponding lower swing limit voltage reaches its practical limit, limiting the oscillation frequency FOSC that can be achieved by the delay cell.

FIG. 21 is an equation that describes the effective resistance REFF of the novel symmetric load. Because the level shift circuit 123 of FIG. 15 holds the lower swing limit voltage constant, voltage swing remains constant for all values of ICTL. Thus, the voltage swing variable defined by VDSAT plus VT in FIG. 19 is replaced by a constant voltage swing in the equation of FIG. 21. The effective resistance REFF of the novel symmetric load is therefore approximately inversely proportional to ICTL.

Figure 22:
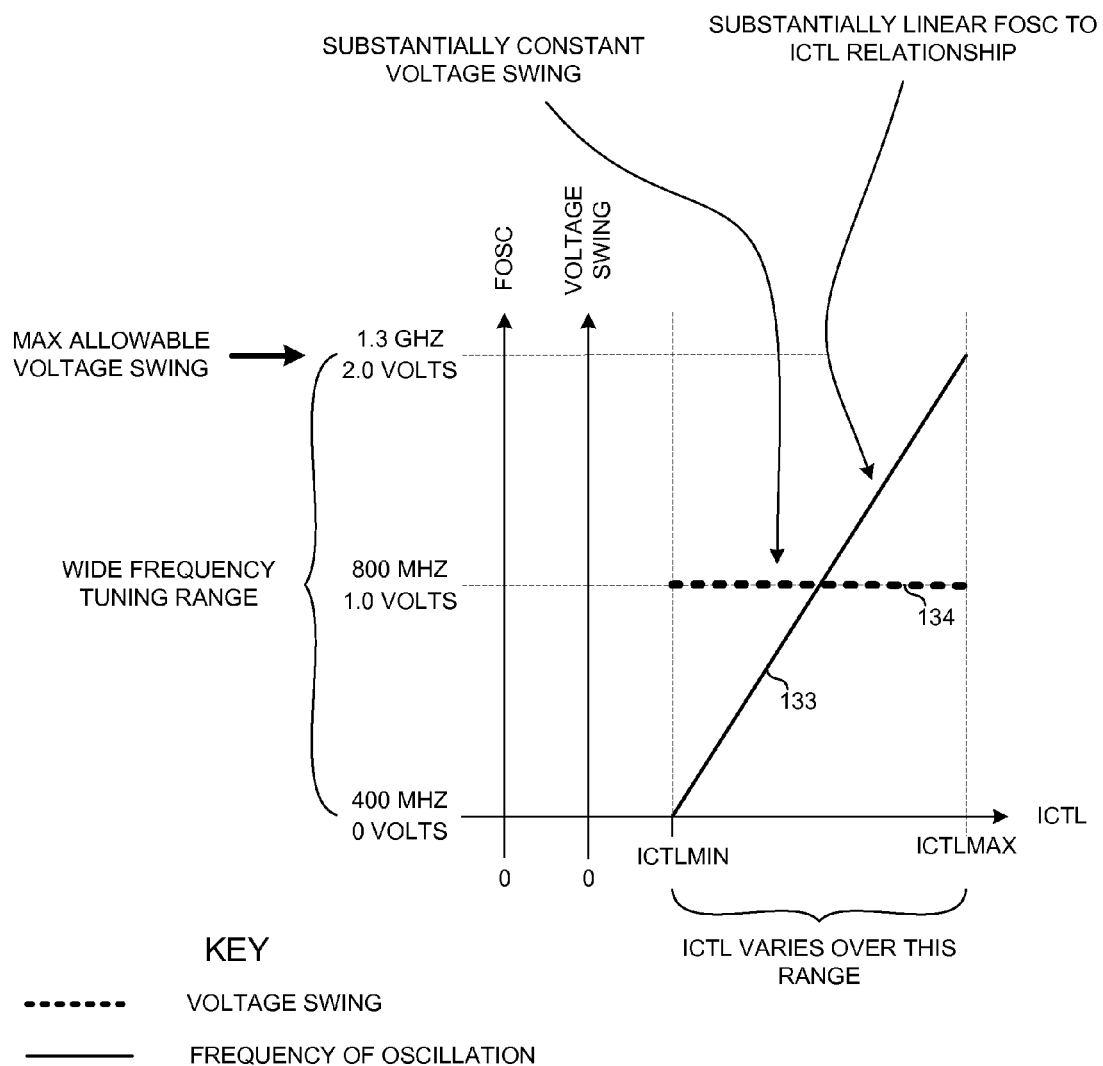
FIG. 22 is a diagram that illustrates the relationship of the input control current ICTL to oscillation frequency FOSC in the novel Current Controlled Oscillator ICO of FIG. 9 that includes the novel symmetric load and novel bias control circuit.

FIG. 22 is a diagram that illustrates the relationship of control current ICTL to oscillation frequency FOSC in a Current Controlled Oscillator ICO using the novel symmetric load. As shown in FIG. 21, effective resistance REFF of the novel symmetric load decreases proportionally with increases in control current. Thus, oscillation frequency FOSC increases linearly and proportionally with respect to control current ICTL, as shown by line 133. Voltage swing, shown by line 134, remains substantially constant. The tuning range of the novel Current Controlled Oscillator (ICO) 50 of FIG. 9 is therefore not limited by voltage swing. In one example: 1) the lower swing limit voltage changes by less than five percent over an FOSC range of more than three hundred percent, and 2) FOSC varies less than ten percent from a perfectly linear oscillating frequency to frequency control input signal (ICTL) relationship over an FOSC range of more than three hundred percent.

Figure 23:
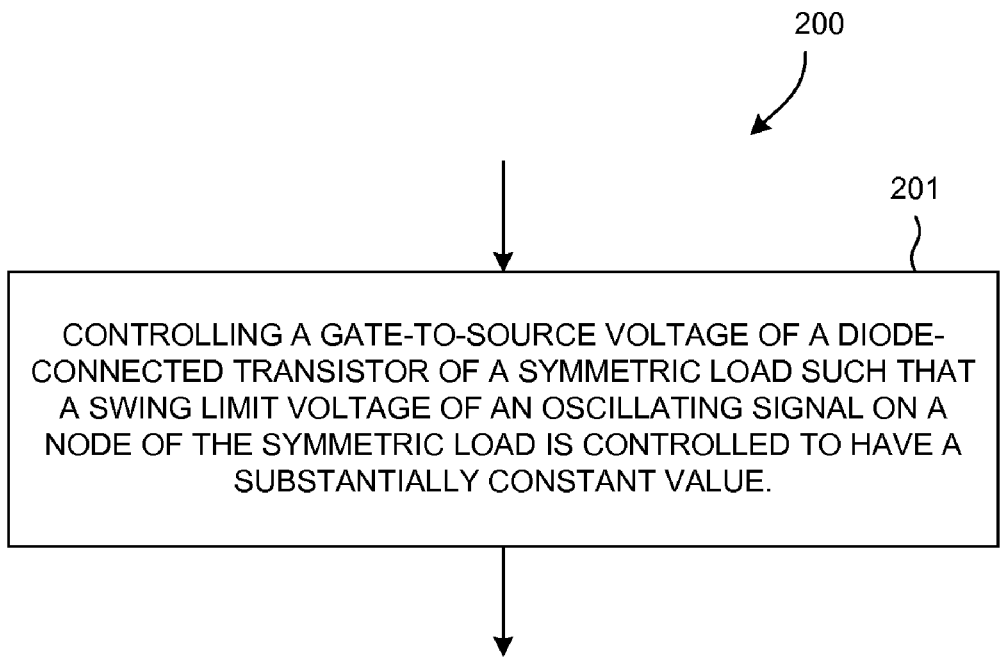
FIG. 23 is a simplified flowchart of a method 200 in accordance with one novel aspect.

FIG. 23 is a simplified flowchart of a method 200 in accordance with one novel aspect. In method 200, a gate-to-source voltage of a diode-connected transistor of a symmetric load is controlled (step 201) such that a swing limit voltage of an oscillating signal on a node of the symmetric load is controlled to have a substantially constant value. In one example of method 200, the swing limit voltage is a lower swing limit voltage of an oscillating signal present on node 75 of FIG. 10.

Figure 24:
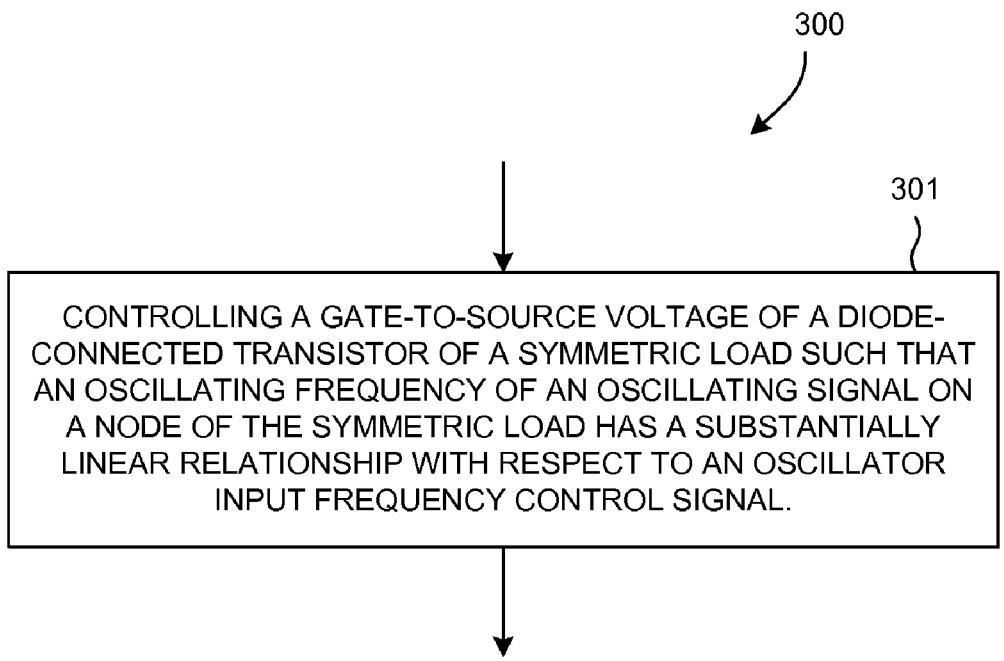
FIG. 24 is a simplified flowchart of a method 300 in accordance with one novel aspect.

FIG. 24 is a simplified flowchart of a method 300 in accordance with one novel aspect. In method 300, a gate-to-source voltage of a diode-connected transistor of a symmetric load is controlled (step 301) such that an oscillating frequency (FOSC) of an oscillating signal on a node of the symmetric load has a substantially linear relationship with respect to an oscillator input frequency control signal. In one example of method 300, the oscillating signal is present on node 75 of FIG. 10 whereas the oscillator frequency control signal is input signal ICTL that is present on input lead 58 of ICO 50 of FIG. 9. The substantially linear relationship between ICTL and FOSC is illustrated in FIG. 22.

The techniques described herein may be implemented by various means. For example, the above-disclosed control techniques for controlling a gate voltage of a diode-connected transistor of a symmetric load may be implemented in hardware, firmware, software, or a combination thereof. For a hardware implementation, the processing units used to perform the techniques may be implemented within one or more dedicated circuits, Application Specific Integrated Circuits (ASICs), Digital Signal Processors (DSPs), Digital Signal Processing Devices (DSPDs), Programmable Logic Devices (PLDs), Field Programmable Gate Arrays (FPGAs), processors, controllers, micro-controllers, microprocessors, electronic devices, other electronic units designed to perform the functions described herein, a computer, or a combination thereof. For a firmware and/or software implementation, the techniques may be implemented with code (e.g., programs, routines, procedures, modules, functions, instructions, etc.) that performs the functions described herein. In general, any computer/processor-readable medium tangibly embodying firmware and/or software code may be used in implementing the techniques described herein. For example, the firmware and/or software code may be stored in a memory and executed by a processor. The memory may be implemented within the processor or may be external to the processor. The firmware and/or software code may also be stored in a computer/processor-readable medium such as Random Access Memory (RAM), Read-Only Memory (ROM), Non-Volatile Random Access Memory (NVRAM), Programmable Read-Only Memory (PROM), Electrically Erasable PROM (EEPROM), FLASH memory, floppy disk, Compact Disc (CD), Digital Versatile Disc (DVD), magnetic or optical data storage device, etc. The code may be executable by one or more computers/processors and may cause the computer/processor (s) to perform certain aspects of the functionality described herein.

Although certain specific embodiments are described above for instructional purposes, the teachings of this patent document have general applicability and are not limited to the specific embodiments described above. The delay cell of FIG. 10 as controlled by the control circuit of FIG. 11, for example, has general utility as a delay cell and sees use in applications other than in oscillators. Also, various ways of controlling and adjusting the gate-to-source voltage of a diode-connected transistor of a symmetric load other than the specific embodiment illustrated in FIGS. 10 and 11 are possible. For example, the size of the ZVT (zero threshold voltage) transistor may be sized such that its gate-to-source voltage changes by the same amount as the load P-channel transistor when the control current ICTL changes. Ways of implementing a controllable level shifting device other than the specific circuit illustrated above in FIGS. 10 and 18 are possible. The particular level shifting circuit of FIGS. 10 and 18 is set forth above as one example of a suitable circuit. Accordingly, various modifications, adaptations, and combinations of the various features of the described specific embodiments can be practiced without departing from the scope of the claims that are set forth below.

What is claimed is:

1. An oscillator comprising:
   a delay cell comprising:
   a first symmetric load comprising a first current source-connected transistor, a first diode-connected transistor, and a first level shift circuit, wherein a drain of the first current source-connected transistor is coupled to a drain of the first diode-connected transistor, and wherein the first level shift circuit comprises a first transistor having a gate, a source and a drain, wherein the gate of the first transistor is coupled to the drain of the first current source-connected transistor and to the drain of the first diode-connected transistor, wherein the drain of the first transistor is coupled to a supply voltage node, and wherein the source of the first transistor is coupled to a gate of the first diode-connected transistor; and
   a control circuit that controls the level shift circuit such that the level shift circuit adjusts a gate voltage of the diode-connected transistor, wherein the adjusting of the gate voltage causes a lower swing limit of an output signal of the delay cell to be substantially constant as an oscillating frequency of the oscillator changes.

2. The oscillator of claim 1, wherein the lower swing limit changes by less than five percent over an oscillating frequency range of more than three hundred percent.

3. The oscillator of claim 1, wherein the control circuit receives a frequency control input signal, wherein changes to the frequency control input signal have a substantially linear relationship with respect to corresponding changes in the oscillating frequency of the oscillator, and wherein the oscillating frequency varies less than ten percent from a perfectly linear oscillating frequency to frequency control input signal relationship over an oscillating frequency range of more than three hundred percent.

4. The oscillator of claim 1, wherein the delay cell further comprises:
a second symmetric load, the second symmetric load comprising:
a second current source-connected transistor;
a second diode-connected transistor; and
a second level shift circuit, wherein a drain of the second current source-connected transistor of the second symmetric load is coupled to a drain of the second diode-connected transistor of the second symmetric load, and wherein the control circuit controls the second level shift circuit of the second symmetric load.

5. The oscillator of claim 4, wherein the delay cell further comprises:
a tail current source transistor, wherein the control circuit supplies a first bias signal onto a gate of the first current source-connected transistor of the first symmetric load and onto a gate of the second current source-connected transistor of the second symmetric load, and wherein the control circuit supplies a second bias signal onto a gate of the tail current source transistor.

6. The oscillator of claim 5, wherein the delay cell further comprises:
a first switching transistor; and
a second switching transistor, the first switching transistor having a drain coupled to the first symmetric load and having a source coupled to the tail current source transistor, the second switching transistor having a drain coupled to the second symmetric load and having a source coupled to the tail current source transistor, wherein a gate of the first switching transistor is a first input node of the delay cell and the drain of the first switching transistor is a first output node of the delay cell, and wherein a gate of the second switching transistor is a second input node of the delay cell and the drain of the second switching transistor is a second output node of the delay cell.

7. The oscillator of claim 4, wherein the second level shift circuit comprises:
a third transistor having a gate, a source and a drain, wherein the gate of the third transistor is coupled to the drain of the current source-connected transistor and to the drain of the diode-connected transistor, wherein the drain of the third transistor is coupled to a supply voltage node, and wherein the source of the first transistor is coupled to a gate of the diode-connected transistor.

8. The oscillator of claim 1, wherein the first transistor has a threshold voltage of approximately zero volts.

9. The oscillator of claim 1, wherein the first level shift circuit further comprises:
a second transistor having a gate, a source and a drain, wherein the drain of the second transistor is coupled to the source of the first transistor of the first level shift circuit, wherein the source of the second transistor of the first level shift circuit is coupled to a ground node, and wherein the gate of the second transistor is coupled to receive a lower swing limit control signal (LSLCS) from the control circuit.

10. The oscillator of claim 1, wherein the control circuit comprises:
a replica symmetric load, wherein the replica symmetric load includes a third current source-connected transistor, a third diode-connected transistor, and a third level shift circuit, wherein a drain of the third current source-connected transistor of the replica symmetric load is coupled to a drain of the third diode-connected transistor of the replica symmetric load; and
a feedback control circuit that has a first input node, a second input node, and an output node, wherein the first input node is coupled to the drain of the third current source-connected transistor of the replica symmetric load and to the drain of the third diode-connected transistor of the replica symmetric load, and wherein the output node is coupled to the third level shift circuit of the replica symmetric load and to the first level shift circuit of the first symmetric load of the delay cell.

11. The oscillator of claim 10, wherein the feedback control circuit is a differential amplifier, and wherein the second input node of the feedback control circuit is coupled to receive a reference voltage.

12. The oscillator of claim 1, wherein the delay cell is one of the plurality of substantially identical delay cells, and wherein the delay cells of the plurality of substantially identical delay cells are coupled together into a ring.

13. A symmetric load circuit comprising:
a supply voltage node;
a current source-connected transistor having a gate, a source, and a drain, wherein the source of the current source-connected transistor is coupled to the supply voltage node;
a diode-connected transistor having a gate, a source coupled to the source of the current source-connected transistor, and a drain coupled to the drain of the current source-connected transistor; and
a level shift circuit that adjusts a gate-to-source voltage (VGS) of the diode-connected transistor, wherein the level shift circuit includes a transistor having a gate, a source, and a drain, wherein the gate of the transistor of the level shift circuit is coupled to the drain of the current source-connected transistor and to the drain of the diode-connected transistor, and wherein the source of the transistor of the level shift circuit is coupled to the gate of the diode-connected transistor.

14. The symmetric load circuit of claim 13, wherein the symmetric load circuit is a part of an oscillator having a plurality of stages, and wherein a node coupled to the drain of the diode-connected transistor and to the drain of the current source-connected transistor is an output node of one of the stages.

15. The symmetric load circuit of claim 13, wherein the symmetric load circuit has an effective resistance between the supply voltage node and the drain of the current source-connected transistor, and wherein a control signal on the gate of the current source-connected transistor is changed to change the effective resistance.

16. An oscillator comprising:
a current source-connected transistor of a symmetric load;
a diode-connected transistor of the symmetric load, wherein a drain of the current source-connected transistor is coupled to a drain of the diode-connected transistor; and
means for adjusting a gate voltage of the diode-connected transistor such that a lower swing limit of an oscillating signal of the oscillator remains substantially constant as an oscillating frequency of the oscillator changes, wherein the means for adjusting a gate voltage of the diode-connected transistor comprises:
a transistor having
a gate coupled to the drain of the current source-connected transistor and to the drain of the diode-connected transistor, and a source coupled to a gate of the diode-connected transistor of the symmetric load.

17. The oscillator of claim 16, wherein the means in addition to adjusting the gate voltage of the diode-connected transistor is also for outputting a first control signal and a second control signal, wherein the first control signal is supplied to a gate of the current source-connected transistor of the symmetric load, and wherein the second control signal is supplied to a tail current source transistor, wherein the symmetric load and the tail current source transistor are parts of a delay cell of the oscillator.

18. The oscillator of claim 16, wherein the means is a part of the symmetric load.

19. The oscillator of claim 16, wherein the means includes a feedback control loop that is not a part of the symmetric load.

20. A method comprising:
(a) controlling a gate-to-source voltage of a first diode-connected transistor of a first symmetric load such that a swing limit voltage of an oscillating signal on a node of the first symmetric load is controlled to have a substantially constant value, wherein the first symmetric load includes a first current source-connected transistor, wherein a source of the first diode-connected transistor is coupled to a source of the first current source-connected transistor, and wherein a drain of the first diode-connected transistor is coupled to a drain of the first current source-connected transistor;
(b) generating a control signal using a feedback control loop; and
(c) supplying the control signal to a first level shift circuit such that the first level shift circuit controls the gate-to-source voltage in (a).

21. The method of claim 20, wherein the swing limit voltage changes by less than five percent over an oscillating frequency range of the oscillating signal of more than three hundred percent.

22. The method of claim 20, wherein the first symmetric load, a second symmetric load, a first switching transistor, a second switching transistor, and a tail current source transistor are parts of a delay cell, wherein a drain of the first switching transistor is coupled to the first symmetric load, wherein a source of the first switching transistor is coupled to the tail current source transistor, wherein a drain of the second switching transistor is coupled to the second symmetric load, and wherein a source of the second switching transistor is coupled to the tail current source transistor.

23. The method of claim 22, further comprising:
(d) controlling a gate-to-source voltage of a second diode-connected transistor of the second symmetric load such that a swing limit voltage of an oscillating signal on a node of the second symmetric load is controlled to have a substantially constant value.

\* \* \* \* \*